(12) United States Patent
Yamashima et al.

(10) Patent No.: US 9,679,692 B2
(45) Date of Patent: Jun. 13, 2017

(54) REACTOR DEVICE

(71) Applicant: Panasonic Corporation, Osaka (JP)

(72) Inventors: Atsushi Yamashima, Kanagawa (JP); Yuuji Yamaguchi, Kanagawa (JP)

(73) Assignee: PANASONIC INTELLECTUAL PROPERTY MANAGMENT CO., LTD., Osaka (JP)

( * ) Notice: Subject to any disclaimer, the term of this patent is extended or adjusted under 35 U.S.C. 154(b) by 0 days.

(21) Appl. No.: 14/388,522

(22) PCT Filed: Mar. 8, 2013

(86) PCT No.: PCT/JP2013/001482
§ 371 (c)(1),
(2) Date: Sep. 26, 2014

(87) PCT Pub. No.: WO2014/024341
PCT Pub. Date: Feb. 13, 2014

(65) Prior Publication Data
US 2015/0170819 A1 Jun. 18, 2015

(30) Foreign Application Priority Data
Aug. 10, 2012 (JP) .................................. 2012-178138

(51) Int. Cl.
*H01F 27/08* (2006.01)
*H01F 27/02* (2006.01)
(Continued)

(52) U.S. Cl.
CPC ............. *H01F 27/22* (2013.01); *H01F 37/00* (2013.01); *H05K 7/2039* (2013.01)

(58) Field of Classification Search
CPC .......... H01F 37/00; H01F 27/22; H01F 27/02; H01F 27/025; H01F 27/08; H05K 7/20
(Continued)

(56) References Cited

U.S. PATENT DOCUMENTS 3,374,452 A * 3/1968 Judd ............................... 336/60
3,704,390 A * 11/1972 Grahame ................ H01F 38/10
315/276

(Continued)

FOREIGN PATENT DOCUMENTS

| JP | S54-26048 U | 2/1979 |
|---|---|---|
| JP | 10-289825 A | 10/1998 |

(Continued)

OTHER PUBLICATIONS

International Search Report for Application No. PCT/JP2013/001482 dated Jun. 18, 2013.

*Primary Examiner* — Mangtin Lian
(74) *Attorney, Agent, or Firm* — Pearne & Gordon, LLP (57) ABSTRACT

Provided is a reactor device which is inexpensive, has high heat radiation and with which there is a high degree of freedom when positioning the transformer core. A heat-radiating plate (105) of U-shaped cross section is contacted onto an upper face and both side faces of an upper part E core (102) forming a transformer (101) upper part, and a transformer (101) provided with the heat-radiating plate (105) is housed from one face which is open of a reactor case (106), and a potting resin material is charged into the gap between the transformer (101) and the reactor case (106) until a lower edge part of the heat-radiating plate (105) is submerged. The reactor case (106) housing the transformer (101) is installed and secured onto a base providing a cooling mechanism.

8 Claims, 9 Drawing Sheets

(51) Int. Cl.
  *H01F 27/22* (2006.01)
  *H01F 37/00* (2006.01)
  *H05K 7/20* (2006.01)

(58) Field of Classification Search
  USPC .................................. 336/61, 55, 90, 96, 98
  See application file for complete search history.

(56) References Cited

U.S. PATENT DOCUMENTS

| | | | |
|---|---|---|---|
| 6,392,519 B1* | 5/2002 | Ronning | 336/90 |
| 2004/0257187 A1* | 12/2004 | Drummond | H01F 27/22 336/61 |
| 2012/0119869 A1* | 5/2012 | Yamamoto | H01F 27/255 336/212 |
| 2012/0299685 A1* | 11/2012 | Yokota | H01F 37/00 336/212 |
| 2013/0002384 A1* | 1/2013 | Tokota | H01F 27/022 336/96 |

FOREIGN PATENT DOCUMENTS

| | | |
|---|---|---|
| JP | 2001-210530 A | 8/2001 |
| JP | 2004-095570 A | 3/2004 |
| JP | 2010-010453 A | 1/2010 |
| JP | 2010-272584 A | 12/2010 |
| JP | 2011-066242 A | 3/2011 |
| WO | WO 2011/161769 A1 * | 12/2011 |
| WO | WO 2011/161770 A1 * | 12/2011 |

\* cited by examiner

POTTING RESIN MATERIAL

REACTOR DEVICE

TECHNICAL FIELD

The present invention relates to a reactor apparatus having excellent heat radiation properties.

BACKGROUND ART

In recent years, plug-in hybrid electric vehicles (hereinafter, referred to as PHEVs) and electric vehicles (hereinafter, referred to as EVs) have been popularized. Such a PHEV or EV includes an in-vehicle charger that converts AC power supplied from outside into a direct current and outputs the direct current to a storage battery of the vehicle. The in-vehicle charger includes a reactor apparatus having a coil for an improvement in a power factor or smoothing.

A very high voltage of approximately 400 V is applied to the reactor apparatus used for an in-vehicle charger of the PHEV or EV. For this reason, the temperature of the coil becomes very high due to heat generation. In this case, in order to prevent overheating of the coil in the in-vehicle charger, it is important to provide a reactor apparatus having very high heat radiation properties. Additionally, it is also important to provide reliable electric insulation properties between the coil and a housing member for the coil.

As to a reactor apparatus including a coil, a technique disclosed in Patent Literature (hereinafter, abbreviated as PTL) 1 is known. The reactor apparatus disclosed in PTL 1 will be described below with reference to FIG. 1.

Figure 1:
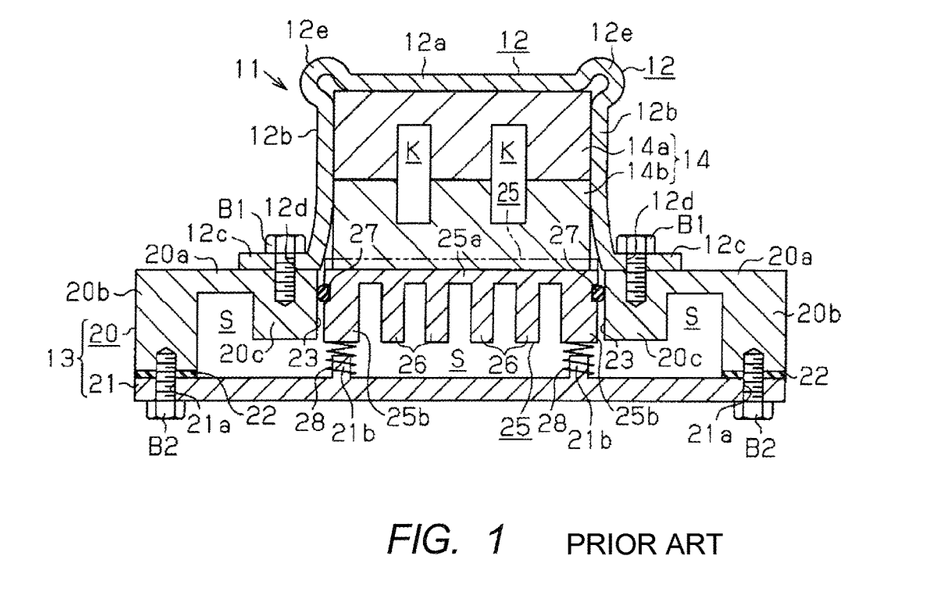
FIG. 1 is a configuration diagram of a reactor apparatus disclosed in PTL 1.

Bracket 12 surrounding transformer core 14 placed in heat sink 13 includes holding section 12a formed so as to be in close contact with transformer core 14, and heat transfer sections 12b extended from both ends of holding section 12a toward heat sink 13. The lower end (fixing section 12c) of each heat transfer section 12b is fixed to heat sink 13 with bolt B1. In heat sink 13, attachment hole 23 is formed at the position where transformer core 14 is disposed, and transformer core placement base 25 is provided at attachment hole 23. Then, transformer core 14 is fixed to heat sink 13 while being held between transformer core placement base 25, which is biased by compression coil spring 28 toward bracket 12, and holding section 12a of bracket 12.

According to the above-described configuration of the reactor apparatus disclosed in PTL 1, transformer core 14 even having non-uniform outside dimensions can be fixed to heat sink 13 while causing holding section 12a to be in close contact with top core 14a. Therefore, the heat generated from transformer 11 can readily be released to heat sink 13 through bracket 12.

Another reactor apparatus using resin having high thermal conductivity for enhancing heat radiation properties is disclosed in PTL 2. The reactor apparatus disclosed in PTL 2 will be described below with reference to FIG. 2.

Figure 2:
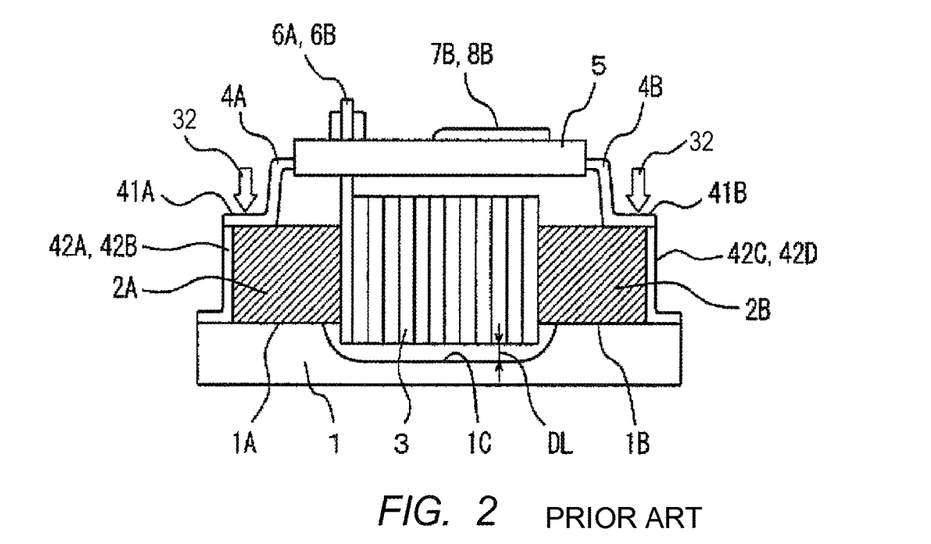
FIG. 2 is a configuration diagram of a reactor apparatus disclosed in PTL 2.

The reactor apparatus includes base 1, core 2, coil 3, and fixing members 4A and 4B. Both ends 2A and 2B of core 2 are mounted on holding sections 1A and 1B of base 1, pressing surface 41A of fixing member 4A presses end 2A of core 2 against holding section 1A, and pressing surface 41B of fixing member 4B presses end 2B of core 2 against holding section 1B. Base 1, core 2, coil 3, and fixing members 4A and 4B are integrally molded using an unsaturated polyester resin having high thermal conductivity.

According to the above-described configuration of the reactor apparatus disclosed in PTL 2, heat generated in core 2 can be efficiently radiated to base 1 through holding sections 1A and 1B and the resin.

CITATION LIST

Patent Literature

PTL 1
Japanese Patent Application Laid-Open No. 2010-10453
PTL 2
Japanese Patent Application Laid-Open No. 2004-95570

SUMMARY OF INVENTION

Technical Problem

However, in the reactor apparatus disclosed in PTL 1, compression coil spring 28 is fixed to boss section 21b formed so as to project within heat sink 13, and the position of transformer core 14 is defined by the position of compression coil spring 28. Thus, there arises a problem in that the flexibility of placement of the transformer core decreases. Moreover, another problem is that the heat is not sufficiently radiated due to the unevenness of metal pieces at the contact points between the metal pieces.

The reactor apparatus disclosed in PTL 2 uses a large amount of expensive unsaturated polyester-based resin, and the problem is therefore an increase in the price of the reactor apparatus.

It is an object of the present invention to provide an inexpensive reactor apparatus being highly flexible in placement of a transformer core and having high heat radiation properties.

Solution to Problem

A reactor apparatus according to an aspect of the present invention includes: a transformer core that includes an upper core and a lower core coupled with each other; a case that houses the transformer core from one opened plane; a resin material that is placed in a gap between the housed transformer core and the case; and a heat radiation member that is in contact with the upper core and the resin material placed in the gap, and that has thermal conductivity.

Advantageous Effects of Invention

According to the present invention, it is possible to provide an inexpensive reactor apparatus being highly flexible in placement of a transformer core and having high heat radiation properties.

DESCRIPTION OF EMBODIMENTS

Hereinafter, an embodiment of the present invention will be described in detail with reference to the accompanying drawings.

(Embodiment)

Figure 3:
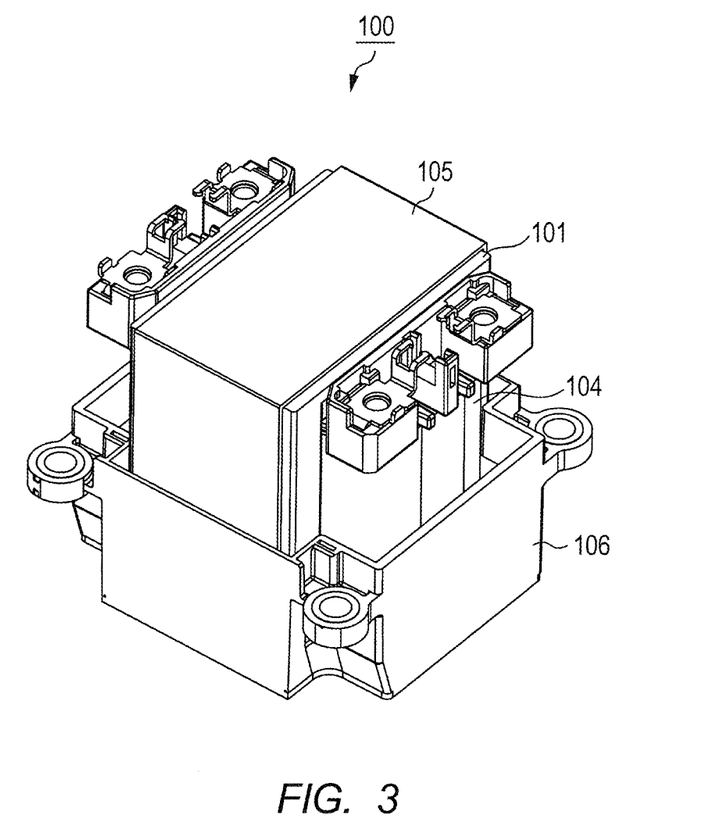
FIG. 3 is a perspective view of a whole reactor apparatus according to an embodiment of the present invention.
Figure 4:
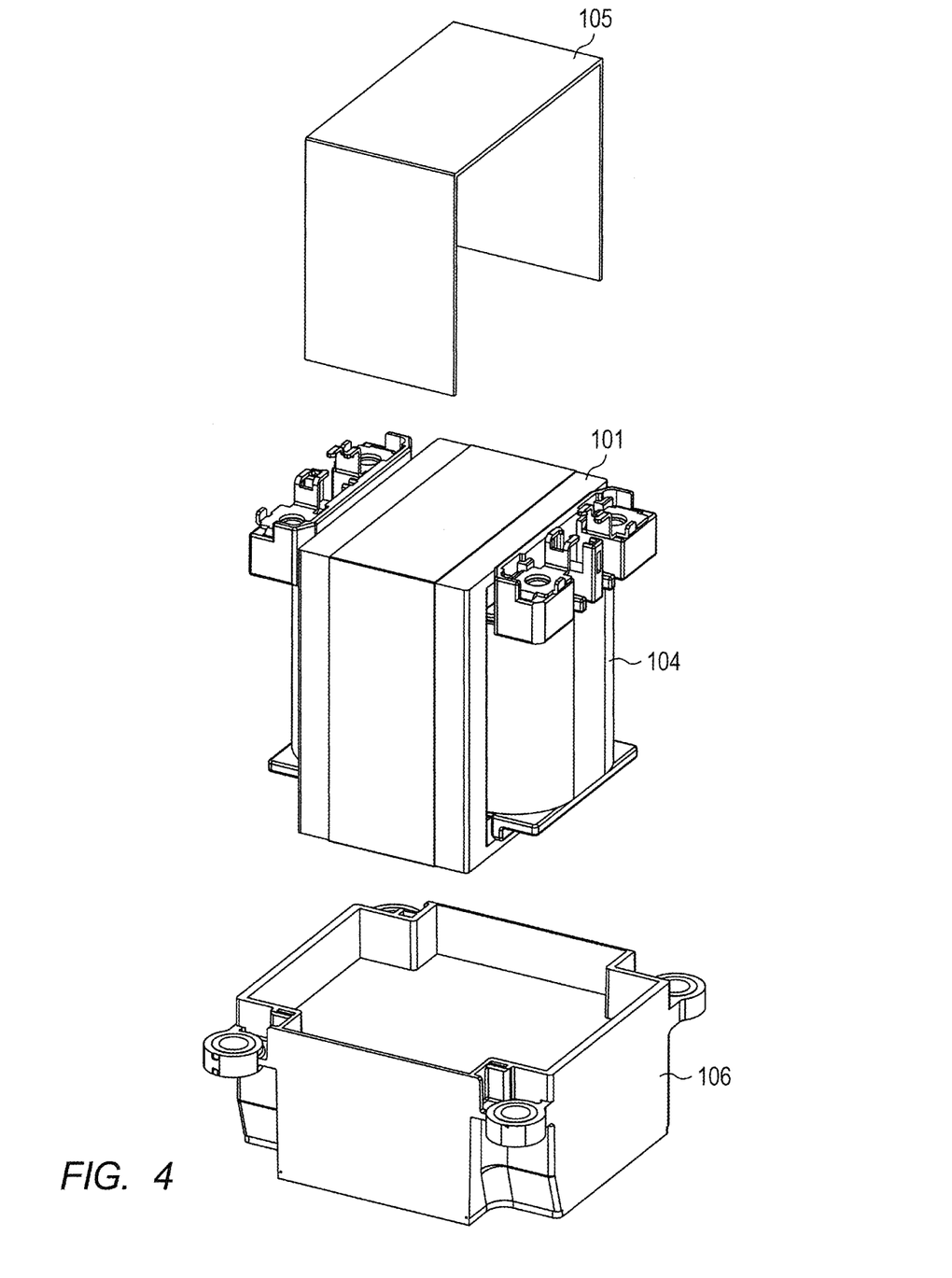
FIG. 4 is an exploded perspective view of the whole reactor apparatus in FIG. 3.
Figure 5:
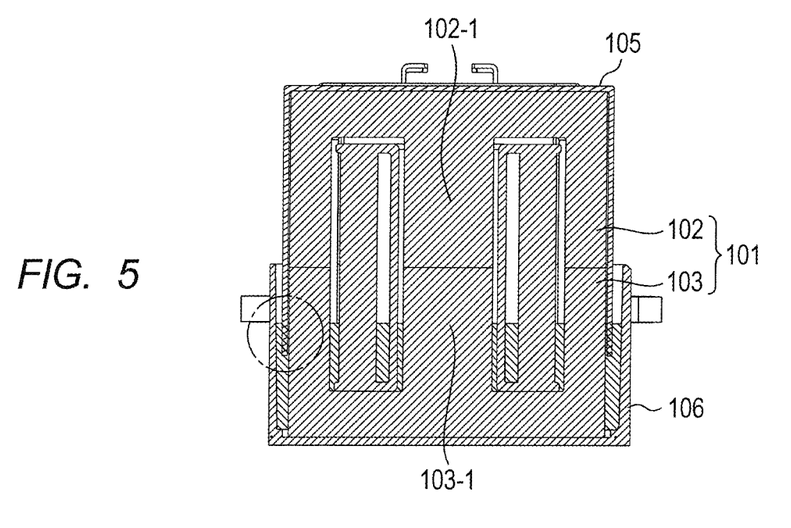
FIG. 5 is a sectional view of the whole reactor apparatus in FIG. 3.
Figure 6:
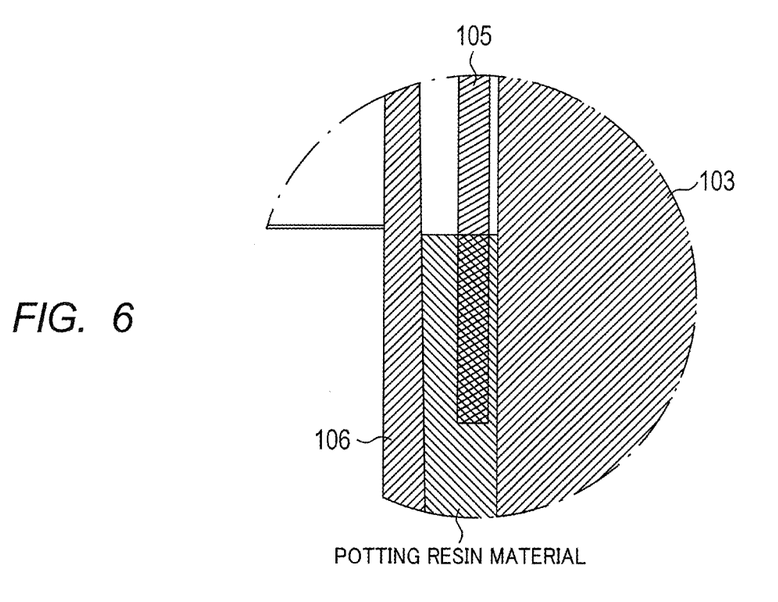
FIG. 6 is an enlarged view of a region surrounded by a circle in the sectional view of FIG. 5.
Figure 7A:
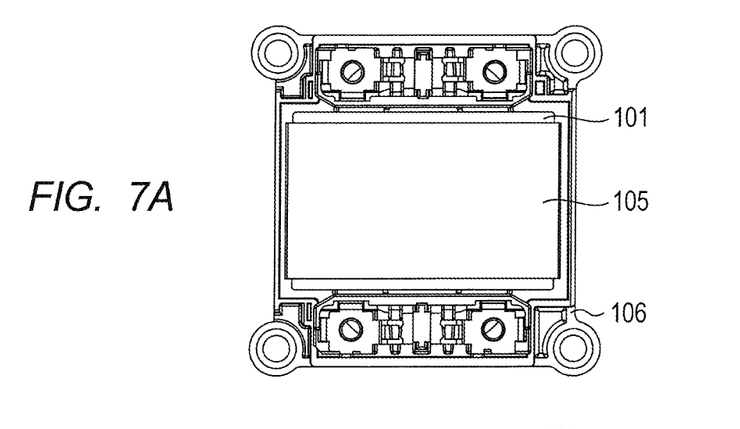
FIGS. 7A to 7C are a top view, a front view, and a right side view of the whole reactor apparatus in FIG. 3, respectively.
Figure 7B:
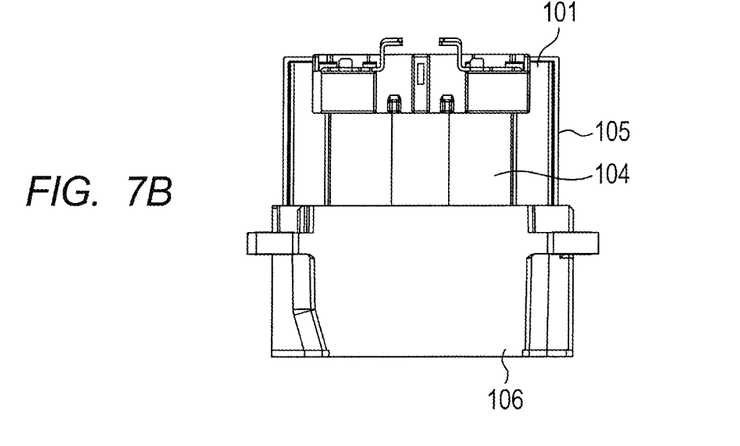
Figure 7C:
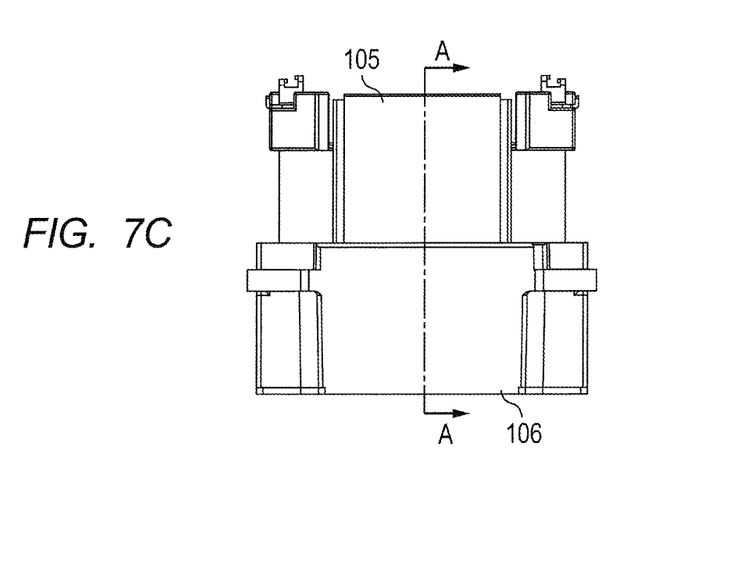

FIG. 3 is a perspective view of whole reactor apparatus 100 according to an embodiment of the present invention; FIG. 4 is an exploded perspective view of whole reactor apparatus 100; FIG. 5 is a sectional view of whole reactor apparatus 100; and FIG. 6 is an enlarged view of a region surrounded with a circle in the sectional view of FIG. 5. FIG. 7A is a top view of whole reactor apparatus 100 in FIG. 3; FIG. 7B is a front view of whole reactor apparatus 100 in FIG. 3; and FIG. 7C is a right side view of whole reactor apparatus 100 in FIG. 3.

As illustrated in FIG. 5, transformer 101 includes a pair of coupled upper E core 102 and lower E core 103 having letter E shaped cross sections, and a coil (not illustrated) is wound around middle leg portions 102-1 and 103-1 of upper E core 102 and lower E core 103, respectively. Bobbin 104 made of an insulating material is disposed at the outer circumference of the coil. Bobbin 104 is a cylinder covering the outer circumference of the coil.

Radiator plate 105 covering the upper surface and both right and left side surfaces of transformer 101 having such a configuration is fitted to the outer circumference of transformer 101. As illustrated in FIG. 5, radiator plate 105 is formed by bending a metal material so as to have a letter U-shaped cross section. Examples of typical metal materials employed as radiator plate 105 include inexpensive aluminum having excellent thermal conductivity.

Transformer 101 is also housed in reactor case 106, and a potting resin material (not illustrated) is poured, placed, and cured in a gap between the side wall of reactor case 106 and transformer 101. At this time, the potting resin material is placed so that the lower end of radiator plate 105 soaks (see FIG. 6) but upper E core 102 does not soak. More specifically, the gap may be filled in height equal to or more than ¼ but less than ½ of the height of transformer 101. This can achieve sufficient heat radiation properties and can reduce a usage amount of an expensive potting resin material to a low level. Moreover, the cured potting resin material can fix radiator plate 105 and can conduct heat generated in transformer 101, from radiator plate 105 to reactor case 106. Examples of this potting resin material include a general silicon-based or epoxy-based resin.

Reactor case 106 has a bottom surface made of a metallic plate having high thermal conductivity, a side wall vertically extending from the bottom surface, and one opened plane from which transformer 101 is housed. Reactor case 106 is fixed to a base (not illustrated) that includes a cooling mechanism, while the bottom surface of reactor case 106 is installed to the base. That is, in the present embodiment, the bottom surface of reactor case 106 only needs to be fixed so as to be in contact with the base (for example, a heat sink), and bracket 12 (radiator plate 105 in the present invention) does not need to be fixed using, for example, bolt B1 so as to be in contact with heat sink 13 (the base in the present invention) unlike PTL 1.

In this way, reactor apparatus 100 can be more flexible in placement of reactor apparatus 100, and it is thus possible to change the design easily, for example. Moreover, reactor case 106 can be cooled by conducting heat transmitted from the potting resin material to the base from the metal plate at the bottom surface.

Moreover, the side wall of the reactor case 106 has a height nearly equal to the height of lower E core 103, and only needs to have at least a height capable of soaking the lower end of heat sink 105 in the potting resin material. This configuration can reduce the height of the side wall of the reactor case and can contribute to space-saving for reactor apparatus 100.

In reactor apparatus 100 having such a configuration, heat generated in transformer 101 transmits to radiator plate 105 in contact with the upper surface and the side surfaces of transformer 101, and transmits from the lower end of the radiator plate to the potting resin material, reactor case 106, and the base in this order, and this can cool transformer 101 housing upper E core 102.

In this way, in the present embodiment, radiator plate 105 is brought into contact with the outer circumference of upper E core 102 forming the upper part of transformer 101, and the gap between transformer 101 and reactor case 106 is filled with the potting resin material until the lower end of radiator plate 105 soaks. This can improve the heat radiation properties of reactor apparatus 100, can reduce a usage amount of an expensive potting resin material to a low level, and can provide reactor apparatus 100 at a low cost.

Moreover, transformer 101 is housed from one opened plane of reactor case 106, and reactor case 106 is fixed to the base. Thereby, reactor apparatus 100 can be more flexible in placement of reactor apparatus 100, and it is thus possible to change the design easily, for example.

Meanwhile, the present embodiment has been described with the configuration employing the radiator plate having a letter U-shaped cross section, but the present invention is not limited to this configuration. Hereinafter, the radiator plate having a letter L-shaped cross section will be described.

Figure 8:
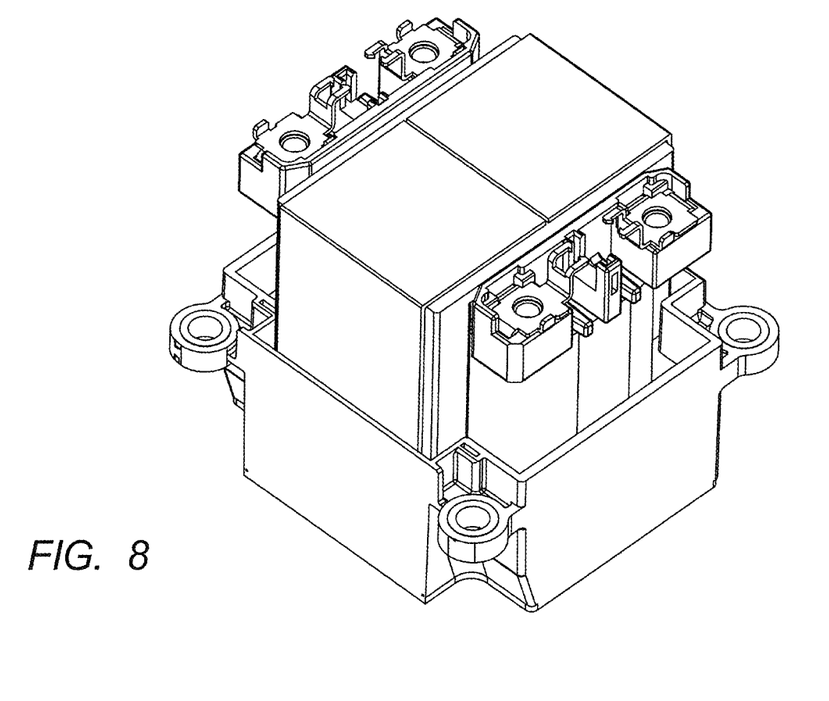
FIG. 8 is a perspective view of the whole reactor apparatus including radiator plates having letter L-shaped cross sections.
Figure 9:
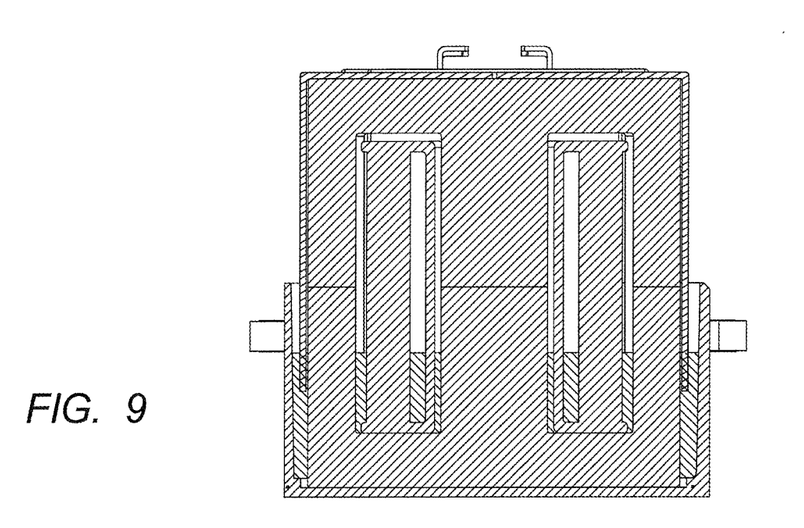
FIG. 9 is a sectional view of the whole reactor apparatus in FIG. 8.
Figure 10A:
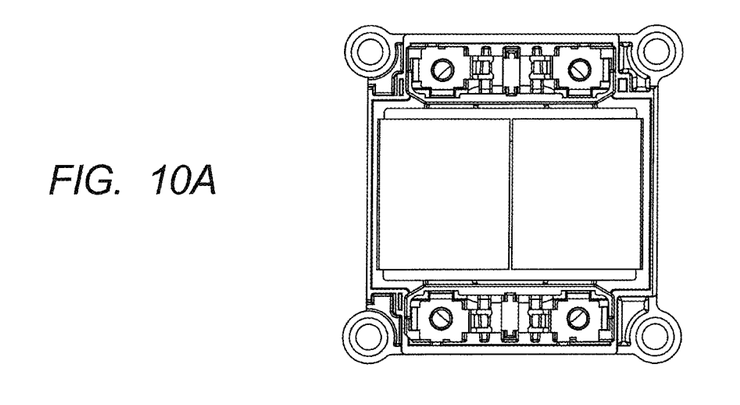
FIGS. 10A to 10C are a top view, a front view, and a right side view of the whole reactor apparatus in FIG. 8, respectively.
Figure 10B:
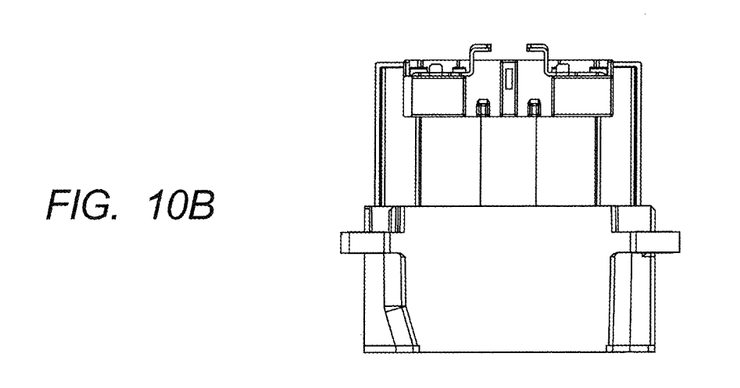
Figure 10C:
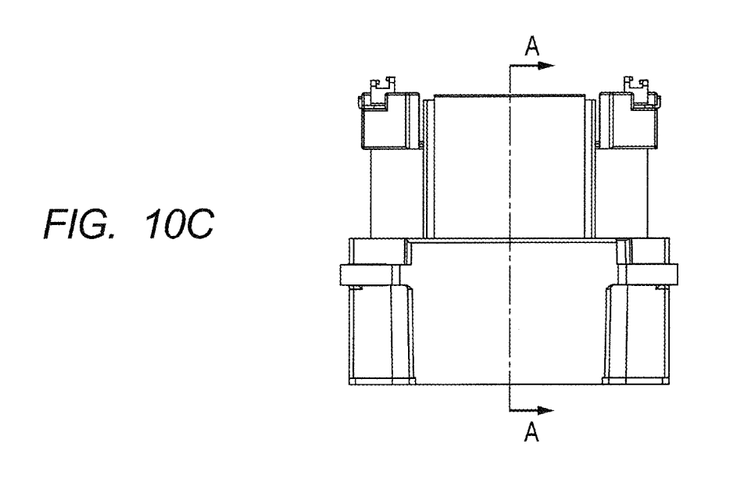

FIG. 8 is a perspective view of the whole reactor apparatus; FIG. 9 is a sectional view of the whole reactor apparatus; FIG. 10A is a top view of the whole reactor apparatus in FIG. 8; FIG. 10B is a front view of the whole reactor apparatus in FIG. 8; and FIG. 10C is a right side view of the whole reactor apparatus in FIG. 8.

As illustrated in these drawings, the combination of two radiator plates having letter L-shaped cross sections may be bonded along the upper surface and both the right and left side surfaces of the transformer. According to this configuration, the radiator plate needs to be bent in only one place. Therefore, the radiator plate can be in closer contact with the transformer because of the upper surface and the side surfaces of the transformer. This can further improve the heat radiation properties. Although FIGS. 8 to 10C illustrate the case of combination of two letter L-shaped radiator plates, one letter L-shaped radiator plate may be bonded along the upper surface and one side surface of the transformer.

Figure 11:
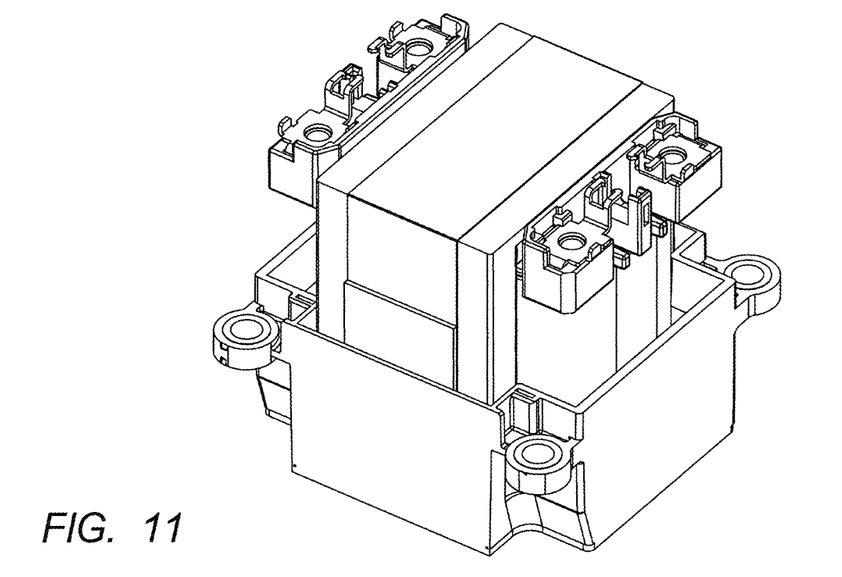
FIG. 11 is a perspective view of the whole reactor apparatus including radiator plates having letter I-shaped cross sections.
Figure 12:
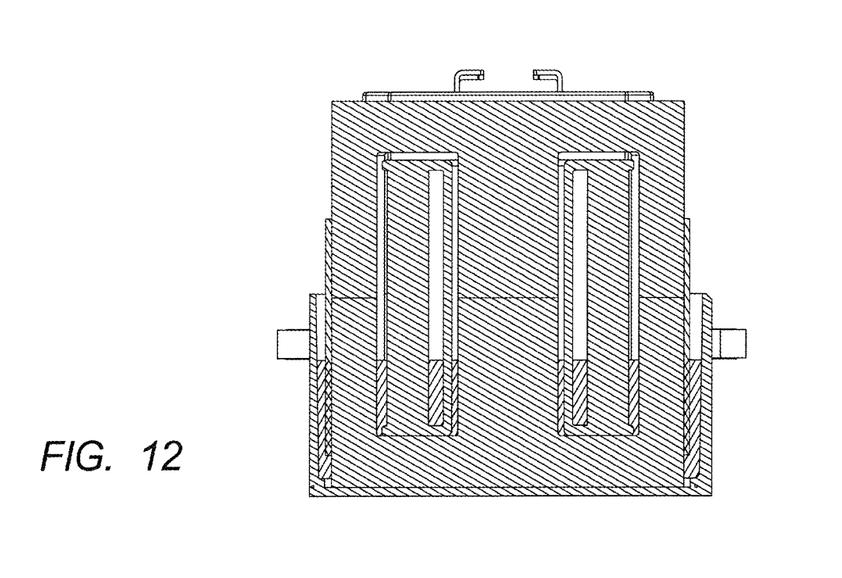
FIG. 12 is a sectional view of the whole reactor apparatus in FIG. 11.
Figure 13A:
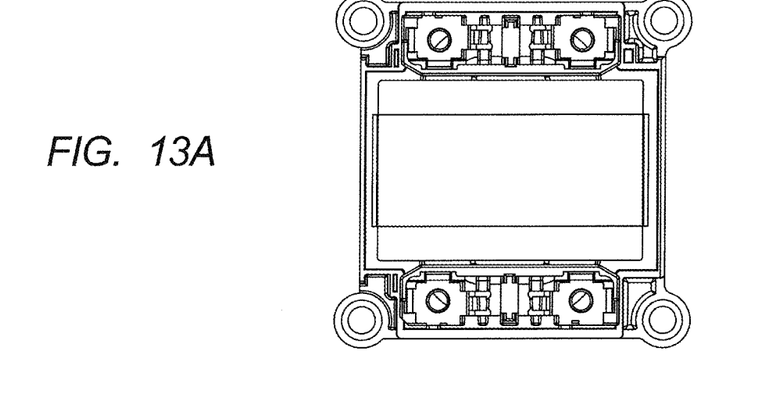
FIGS. 13A to 13C are a top view, a front view, and a right side view of the whole reactor apparatus in FIG. 11, respectively.
Figure 13B:
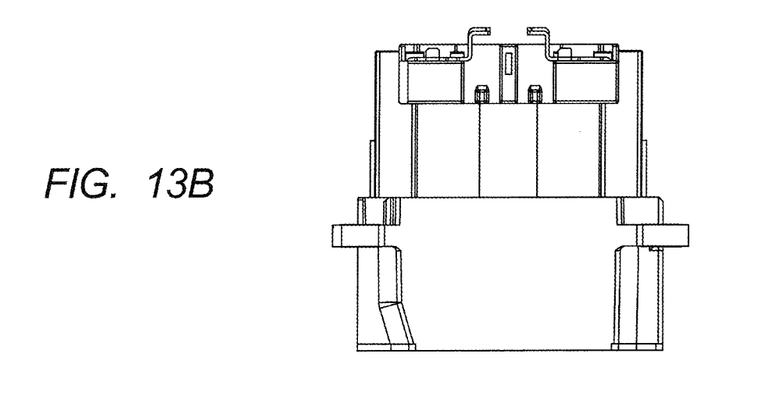
Figure 13C:
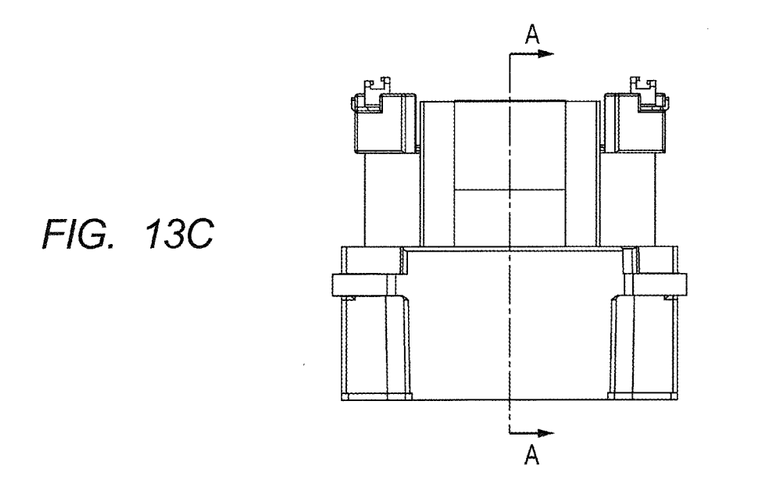

Next, a letter I-shaped cross section will be explained. FIG. 11 is a perspective view of the whole reactor apparatus;

FIG. 12 is a sectional view of the whole reactor apparatus; FIG. 13A is a top view of the whole reactor apparatus in FIG. 11; FIG. 13B is a front view of the whole reactor apparatus in FIG. 11; and FIG. 13C is a right side view of the whole reactor apparatus in FIG. 11.

As illustrated in these drawings, radiator plates having letter I-shaped cross sections may be bonded along both the side surfaces of the transformer. This configuration can reduce the height of the reactor apparatus and is therefore effective when the height direction is restricted in the reactor apparatus mounted in a PHEV or EV. Although FIGS. 11 to 13C illustrate the case of combination of two letter I-shaped radiator plates, one letter I-shaped radiator plate may be bonded along one side surface of the transformer.

In all the cases of using the above-described radiator plates, it is necessary that the radiator plate be partially in contact with the upper E core and that the lower end of the radiator plate soak in the potting resin material.

The disclosure of the specification, drawings, and abstract included in Japanese Patent Application No. 2012-178138 filed on Aug. 10, 2012 is incorporated herein by reference in its entirety.

INDUSTRIAL APPLICABILITY

The reactor apparatus according to the present invention is applicable to a vehicle, such as a PHEV or EV, for example.

REFERENCE SIGNS LIST

100 Reactor apparatus
101 Transformer
102 Upper E core
103 Lower E core
104 Bobbin
105 Radiator plate
106 Reactor case

The invention claimed is:

1. A reactor apparatus comprising:
a transformer core that includes an upper core and a lower core coupled with each other;
a case that has a bottom surface and a side wall and houses the transformer core from one opened plane, the bottom surface of the case being installed to a base;
a resin material that is placed in a gap between the housed transformer core and the case and that is in contact with the lower core; and
a heat radiation member that is in contact with the upper core and the resin material placed in the gap,
wherein the heat radiation member is made of a metal material, and
wherein only a portion of the surface of the lower core is covered with the heat radiation member,
wherein the lower end of the heat radiation member is in contact with the resin material,
wherein a portion of the heat radiation member in contact with the upper core is not in contact with the resin material on the other side thereof, and
wherein the heat at the upper core is transmitted to the heat radiation member, and then transmitted to the resin material through the lower end of the heat radiation member, and then transmitted from the resin material to the case.

2. The reactor apparatus according to claim 1, wherein the transformer core includes two letter E-shaped cores that are coupled together.

3. The reactor apparatus according to claim 1, wherein the resin material is placed in the gap with an amount that fills the gap in height up to less than half of the height of the transformer core.

4. The reactor apparatus according to claim 1, wherein the heat radiation member becomes immovable when the resin material cures.

5. The reactor apparatus according to claim 1, wherein the heat radiation member is aluminum.

6. The reactor apparatus according to claim 1, wherein the heat radiation member has a letter U-shaped, L-shaped, or I-shaped cross section.

7. The reactor apparatus according to claim 1, wherein the case is installed to the base that has a cooling structure.

8. The reactor apparatus according to claim 1, wherein the heat radiation member extends downward from an upper surface of the upper core along one or more sidewalls of the upper core and the lower core and into the resin material.

* * * * *